United States Patent
Ba-Tis et al.

(10) Patent No.: US 12,145,839 B1
(45) Date of Patent: Nov. 19, 2024

(54) DROP RESISTANT MEMS ACTUATOR-IMAGER ASSEMBLY PACKAGE

(71) Applicant: Sheba Microsystems Inc., North York (CA)

(72) Inventors: Faez Ba-Tis, East York (CA); Ahmed Galaom, East York (CA); Ali Banss, East York (CA); Hui Zuo, Richmond Hill (CA)

(*) Notice: Subject to any disclaimer, the term of this patent is extended or adjusted under 35 U.S.C. 154(b) by 0 days.

(21) Appl. No.: 18/595,030

(22) Filed: Mar. 4, 2024

(51) Int. Cl.
*B81B 7/00* (2006.01)

(52) U.S. Cl.
CPC ...... *B81B 7/0058* (2013.01); *B81B 2201/034* (2013.01); *B81B 2203/0163* (2013.01); *B81B 2203/0353* (2013.01); *B81B 2203/04* (2013.01); *B81B 2207/11* (2013.01)

(58) Field of Classification Search
None
See application file for complete search history.

(56) References Cited

U.S. PATENT DOCUMENTS

| | | | |
|---|---|---|---|
| 11,772,962 B1* | 10/2023 | Chen | B81C 1/00269 257/415 |
| 2017/0180619 A1* | 6/2017 | Ba-Tis | H04N 23/55 |
| 2021/0354979 A1* | 11/2021 | Ba-Tis | H04N 23/687 |

* cited by examiner

*Primary Examiner* — Benjamin P Sandvik
(74) *Attorney, Agent, or Firm* — Nasser Ashgriz; UIPatent Inc.

(57) ABSTRACT

A MEMS actuator assembly package features a number of drop test resistant mechanisms is disclosed. These mechanisms are used to decelerate and finally stops the heavy load of the image sensor attached to the MEMS actuators along all six directions of the in-plane and out-of-plane axes (±x, ±y, ±z). The MEMS actuator assembly package comprises first and second sets of flexible stoppers attached to the MEMS actuator along with a set of hard stoppers that engage in a sequential manner with the moving mass of the loaded actuator to decelerate it, bringing it to a complete stop when exposed to mechanical shock along the four directions of the in-plane axes (x and y). When the assembly package is exposed along the positive and negative direction of the z-axis, the moving mass is stopped by features built in the package.

15 Claims, 13 Drawing Sheets

DROP RESISTANT MEMS ACTUATOR-IMAGER ASSEMBLY PACKAGE

FIELD OF THE INVENTION

The invention relates to the field of MEMS electrostatic actuators that moves sensors and optical elements such as image sensors or any optical lens element or a combination of lenses. More specifically it relates to drop test resistant features for MEMS actuators that achieve autofocus (AF), active a thermalization or optical image stabilization (OIS) functions in cameras. Such functions are needed for cameras used in automotive, action, defense, drones, security, mobile robotics, virtual reality, augmented reality, smartphones, laptops and many others.

BACKGROUND OF THE INVENTION

MEMS electrostatic actuators that are used for achieving AF and OIS by moving image sensors in cameras are vulnerable to damage when cameras are exposed to drops and severe shocks. They are usually susceptible to chipping or damage when the moving parts of the MEMS actuators which carry a load (such as an image sensor) hit fixed parts of the actuator or surrounding package as the Silicon material that these actuators are made of is brittle.

Such chipped silicon pieces could reduce the functionality of the devices as it could block the motion of these actuators. They could also negatively affect the quality of the images as the chipped pieces (particles) could cover the image sensor pixels and lead to poor quality of the images streamed by the image sensors.

Mechanical stoppers are widely used in MEMS sensors such as accelerometers and gyroscopes as they usually have a proof mass which is part of the silicon structure of the device itself and is usually in the range of sub-milligram in weight. However, MEMS actuators that move heavy loads such as an image sensor (having weight of 30 to 100 milligrams)—which is usually not part of the device structure—have been known to have challenges in passing the drop test. Such external load carried by the MEMS actuator when subject to a large external acceleration has to be stopped when the motion is undesirable along all six directions (±x, ±y, ±z); with the most challenging directions are the out-of-plane ±z as the load (i.e. the image sensor) cannot be stopped mechanically through motion limiters as any touch to the sensor surface will damage sensor pixels and lead to a defect.

U.S. patent Ser. No. 10/527,420B2 discloses a proof mass stopper mechanism along the in-plane axes (x, y) wherein one set of flexible stoppers attached to the proof mass and spaced a certain distance (g) from the stationary part is used to decelerate the proof mass first and then the mass is stopped at a second (hard stop). It also discloses a stopper mechanism along the vertical positive direction of the z-axis; however, it depends on the tilt motion of the proof mass no pure translation.

U.S. Pat. No. 8,011,247B2 discloses multi-stage beam stoppers to decelerate the motion of the proof mass; however, it does not include a final hard stopper to completely bring the mass to a complete stop and also does not disclose stopper mechanisms to stop the proof mass along the positive and negative directions of the z-axis.

It is clear that there is a need for more complex deceleration mechanisms to enable MEMS actuators that are loaded with heavy masses (e.g. 30-100 mg) which is orders of magnitude larger than that of the proof masses in MEMS sensors (such accelerometers and gyroscopes). The mechanism shall take into account stopping the load (image sensors) along all 6 directions (±x, ±y, ±z).

The present invention overcome such challenges by utilizing a series of flexible stoppers and eventually hard stoppers in the actuator structure to prevent failures in the image sensor loaded MEMS actuator along the in-plane axes (±x, ±y); while utilizing the MEMS package structure as stoppers along the positive and negative out-of-plane directions (±z axis).

SUMMARY OF THE INVENTION

The present invention discloses novel drop test resistant mechanisms to prevent structural damage in the MEMS device—including chipping of silicon or actual damage to the MEMS device parts—when exposed to severe mechanical shocks. The drop test resistant mechanism is incorporated within the structure of the MEMS actuator and the packaging of the MEMS actuator. A MEMS actuator-imager assembly package that incorporates such technique consists of an IR bracket, an IR filter, an image sensor, a MEMS actuator, a MEMS housing, and a circuit board.

In one embodiment of the present invention, the actuator-imager assembly package consists of an IR bracket, an IR filter, an image sensor, a MEMS actuator, a MEMS housing, a circuit board and a connector. The IR bracket is attached to the circuit board using adhesive. The IR bracket is designed with a cavity to fit in the IR filter. The circuit board could be a printed circuit board (PCB) or a flexible printed circuit (FPC) supported with a stiffener. The circuit board is designed with a cut-out sized to fit the image sensor. The circuit board contains electrical elements such as capacitors and resistors needed for the image sensor operation. It also contains the driving circuit for the MEMS actuator. The circuit board also enables signal routing from the sensor to an outside circuit which could be a camera main board. The back side of said circuit board is attached to the MEMS housing, which contains the MEMS actuator holding the sensor. The MEMS actuator consists of a moving part and a fixed part (substrate). The moving part consist of an array of springs holding a rotor with the springs anchored to the substrate. The rotor contains a number of sets of flexible stoppers to decelerate the moving mass of the load during shocks and engage at different motion ranges of the MEMS rotor. These flexible stoppers along with hard stoppers work together to bring the moving mass (rotor and imager) to a complete stop without causing chipping in the silicon along the in-plane axes (±x, ±y). The MEMS rotor has a number of vertical protrusions that penetrate through the stator (substrate). The MEMS housing has a number of cavities that are vertically aligned with these protrusions and work as mechanical stoppers for the rotor and load (moving mass) along the −z axis. These cavities stop the rotor when it travels a vertical distance larger than the required stroke of the actuator along the −z axis and before any hit or touch between the rotor and stator (substrate) occurs. The printed circuit board (PCB) or a flexible printed circuit (FPC) at the top side of the MEMS actuator work as a flexible mechanical stopper along +z axis.

In another embodiment, the MEMS actuator is packaged within a cavity of BGA substrate that is designed to fit the MEMS actuator size. The BGA substrate enables the routing of the signal from the top layer to the bottom layer through interconnecting vias between the layers of the substrate. A stopper plate, with cavity designed to fit the size of the image sensor while overlapping with the MEMS moving part, is attached to the edges of the substrate cavity. This stopper plate stops the MEMS actuator along the +z-axis motion, and it bends when it gets hit by the MEMS moving part (rotor) to absorb a portion of the shock. The BGA substrate further contains a number of balls that help making the connection of the signal to the camera main board. The BGA substrate package offers a small foot print, is mechanically reliable, and it is utilized as a stopper for the MEMS moving part along the positive and negative directions of the z-axis.

BRIEF DESCRIPTION OF DRAWINGS

Embodiments Herein Will Hereinafter be Described in Conjunction with the Appended Drawings Provided to Illustrate and not to Limit the Scope of the Claims, Wherein Like Designations Denote Like Elements, and in which:

DETAILED DESCRIPTION OF THE INVENTION

The present invention of the MEMS actuator-sensor assembly package that utilizes drop resistant features to eliminate chipping or damage of the MEMS actuator silicon parts when exposed to severe mechanical shocks along all six directions (±x, ±y, ±z), is illustrated in FIG. 1A-1H. Such drop resistant mechanisms are key to the functionality of the device as small pieces of silicon that ensue form chipping could limit the motion of the actuator or form particles on the sensor, which leads to image quality degradation.

Figure 1A:
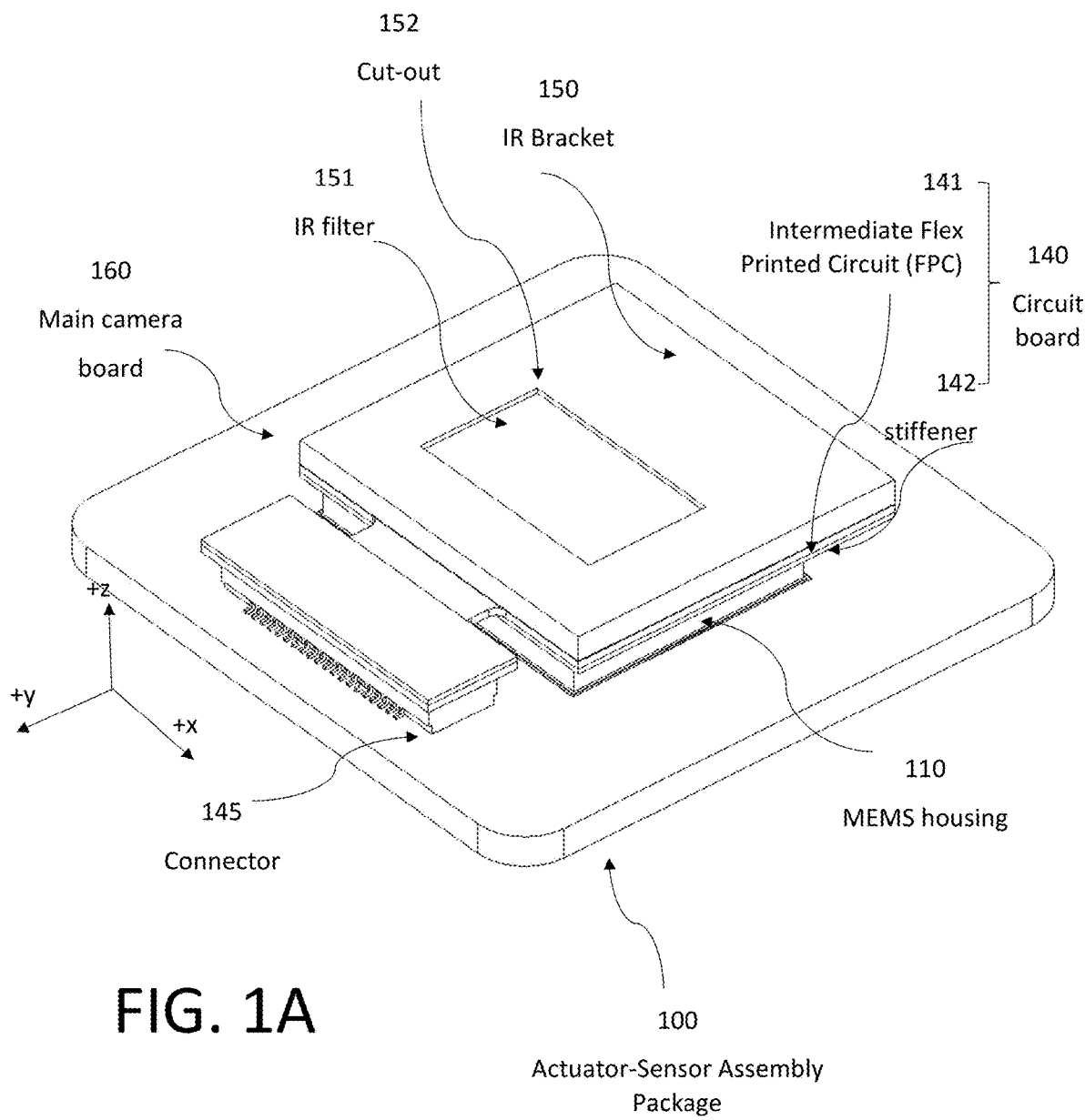
FIG. 1A illustrates an isometric view of the drop resistant MEMS actuator-imager assembly package attached to the camera main board.
Figure 1B:
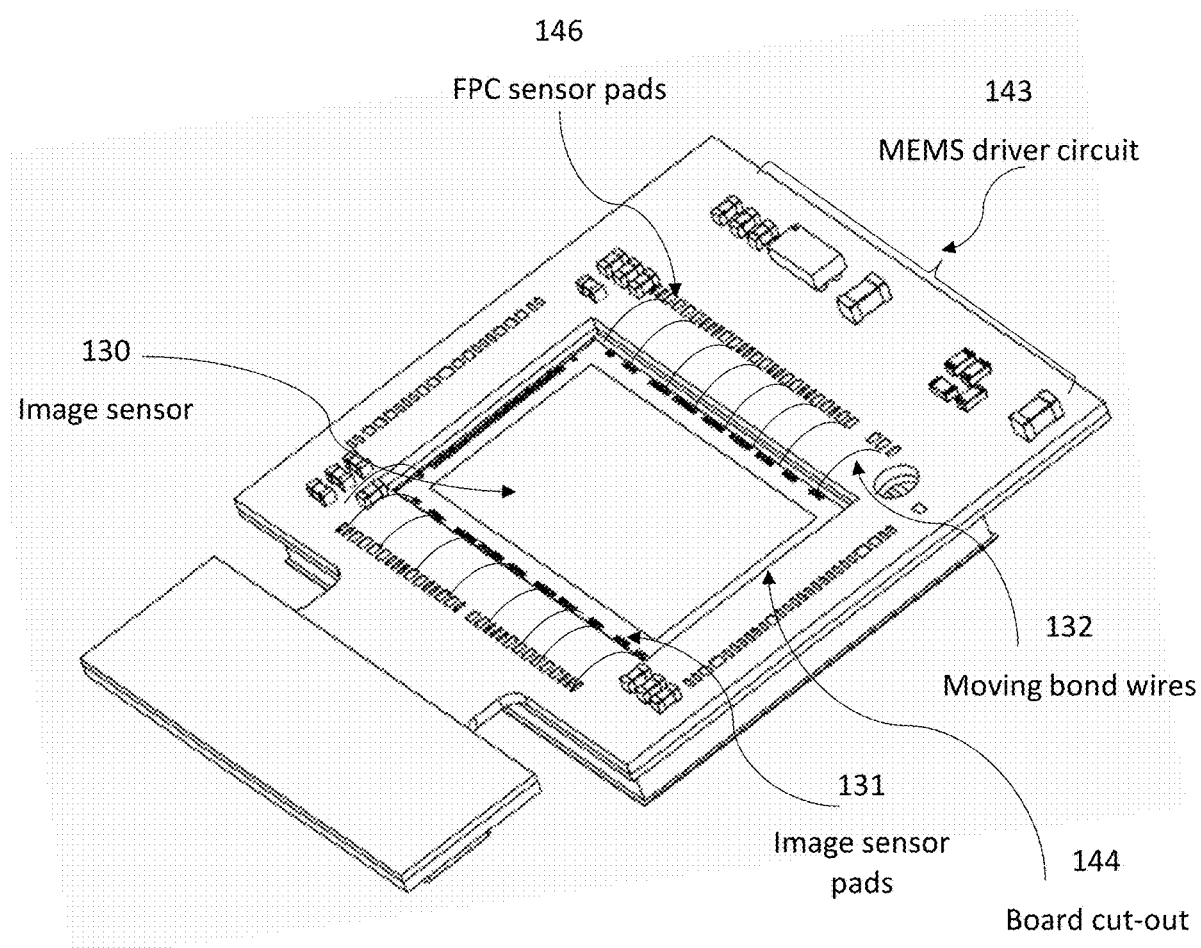
FIG. 1B illustrates an isometric view of a drop resistant MEMS actuator-imager assembly package showing internal components of the package.

In one embodiment of the present invention, the actuator-sensor assembly package consists of an IR bracket 150, an IR filter 151, an image sensor 130, a MEMS actuator 120, a MEMS housing 110, a circuit board 140 and connector 141, refer to FIG. 1A. The IR bracket is attached to the circuit board using adhesive. The IR bracket is designed with a cut-out 152 sized to fit and receive the IR filter. The circuit board could be a printed circuit board (PCB) or a flexible printed circuit (FPC) 141 supported with a stiffener 142. The circuit board is designed with cut-out 144 sized to fit the image sensor, refer to FIG. 1B. The circuit board contains electrical elements such as capacitors and resistors needed for the image sensor operation. It also contains a MEMS driving circuit 143. The MEMS driving circuit could consist of high a voltage chip that utilizes a voltage booster or a charge bump. The high voltage chip provide voltage necessary for the MEMS actuator operation. The circuit board also enables signal routing from the sensor to an outside circuit which could be the camera main board 160 through a connector. The sensor is wired to the circuit board through moving bond wires 132 by means of a wire-bonding process. The moving wires connect between the electrical pads of the image sensor 131 and the electrical pads of the FPC sensor pads 146. The backside of the circuit is attached to the MEMS housing, which contains the MEMS actuator holding the image sensor.

Figure 1C:
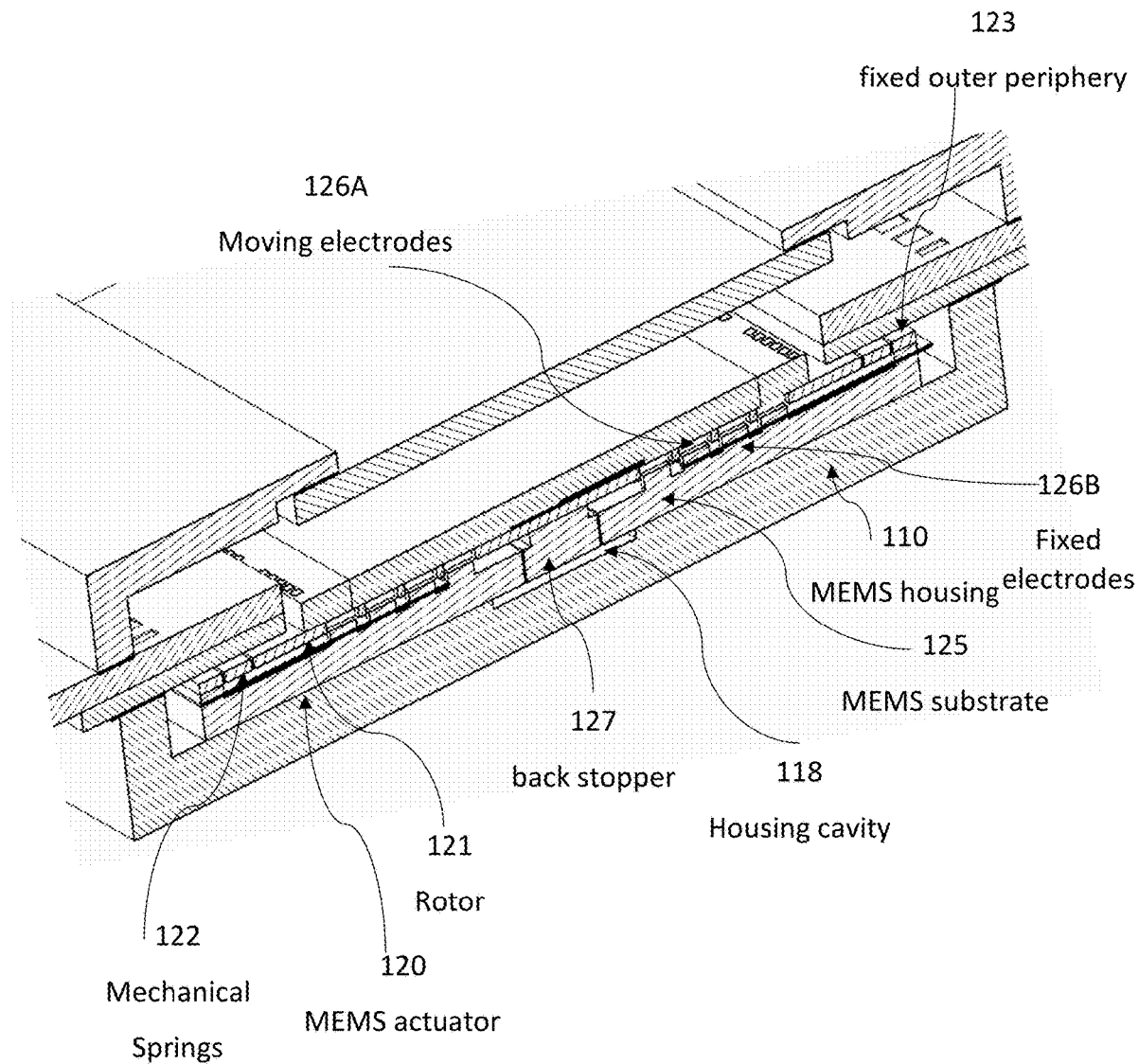
FIG. 1C illustrates a cross sectional view of the drop resistant MEMS actuator-imager assembly package showing the drop resistant features within the MEMS actuator structure and within the package.
Figure 1D:
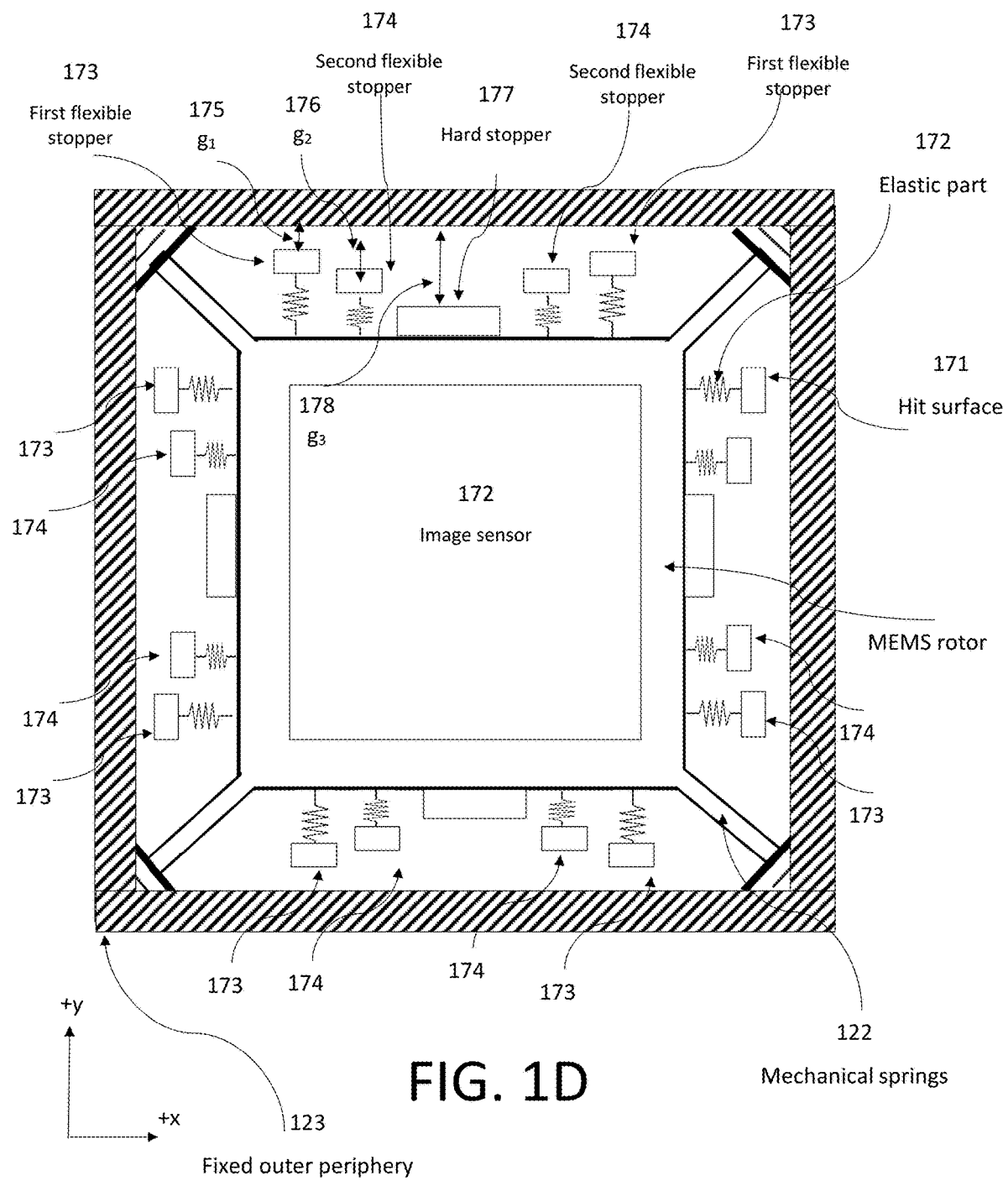
FIG. 1D illustrates the concept of the flexible and hard mechanical stoppers attached to the MEMS rotor that decelerate and finally stop the MEMS along the in-plane axes (±x, ±y)

The MEMS actuator 120 consists of moving and stationary part (MEMS substrate 125), refer to FIG. 1C. The moving part consists of a rotor 121 connected to the stationary part via a plurality of springs 122. The rotor holds the load (optical element such as an image sensor) and contains an array of MEMS moving electrodes 126A forming one polarity of MEMS actuator electrodes. The stationary part (MEMS substrate) consists of outer fixed periphery 123, MEMS fixed electrodes 126B. The rotor contains a first set of moving flexible stoppers 173 attached to the rotor and they maintain a gap $g_1$ 175 from the fixed outer periphery 123 and have a stiffness $K_1$, refer to FIG. 1D. They represent the first set of stoppers to decelerate the moving load in all four directions (±x, ±y) in the presence of severe shocks that may cause the rotor and load to move along the in-plane axes (x and y). Each flexible stopper consists of a hit surface 171 and an elastic 172 part, these flexible stoppers could have the form of free end cantilevers or serpentine springs.

A second set of the moving flexible stoppers 174 extend from the rotor and they are disposed in all four in-plane directions and are spaced from the fixed outer periphery with gap $g_2$ 176 that is larger than $g_1$ and have a higher stiffness $K_2$ than that of the first flexible stoppers. They engage with the fixed outer periphery after the first flexible stoppers are squeezed causing further deceleration of the moving mass. The hard stoppers 177, which are spaced with a gap $g_3$ 178 that is larger than that of $g_1$ and $g_2$, engage last after both first and second flexible stoppers are squeezed as they engage the fixed outer periphery bringing the moving mass to a complete stop.

Figure 1E:
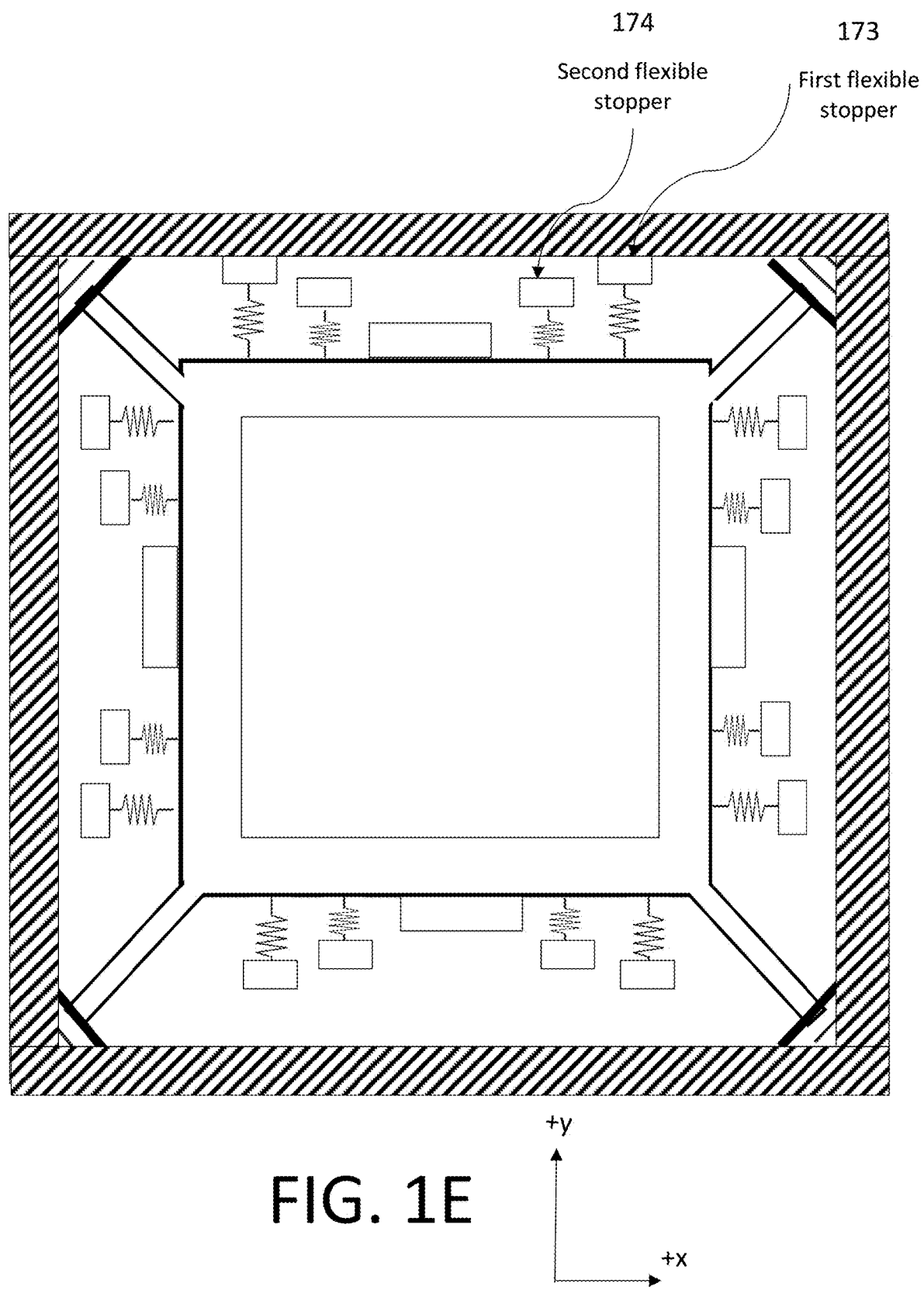
FIG. 1E illustrates the movement of the moving mass (rotor and image sensor) along the +y direction and the engagement of the first flexible stoppers with stationary outer periphery.
Figure 1F:
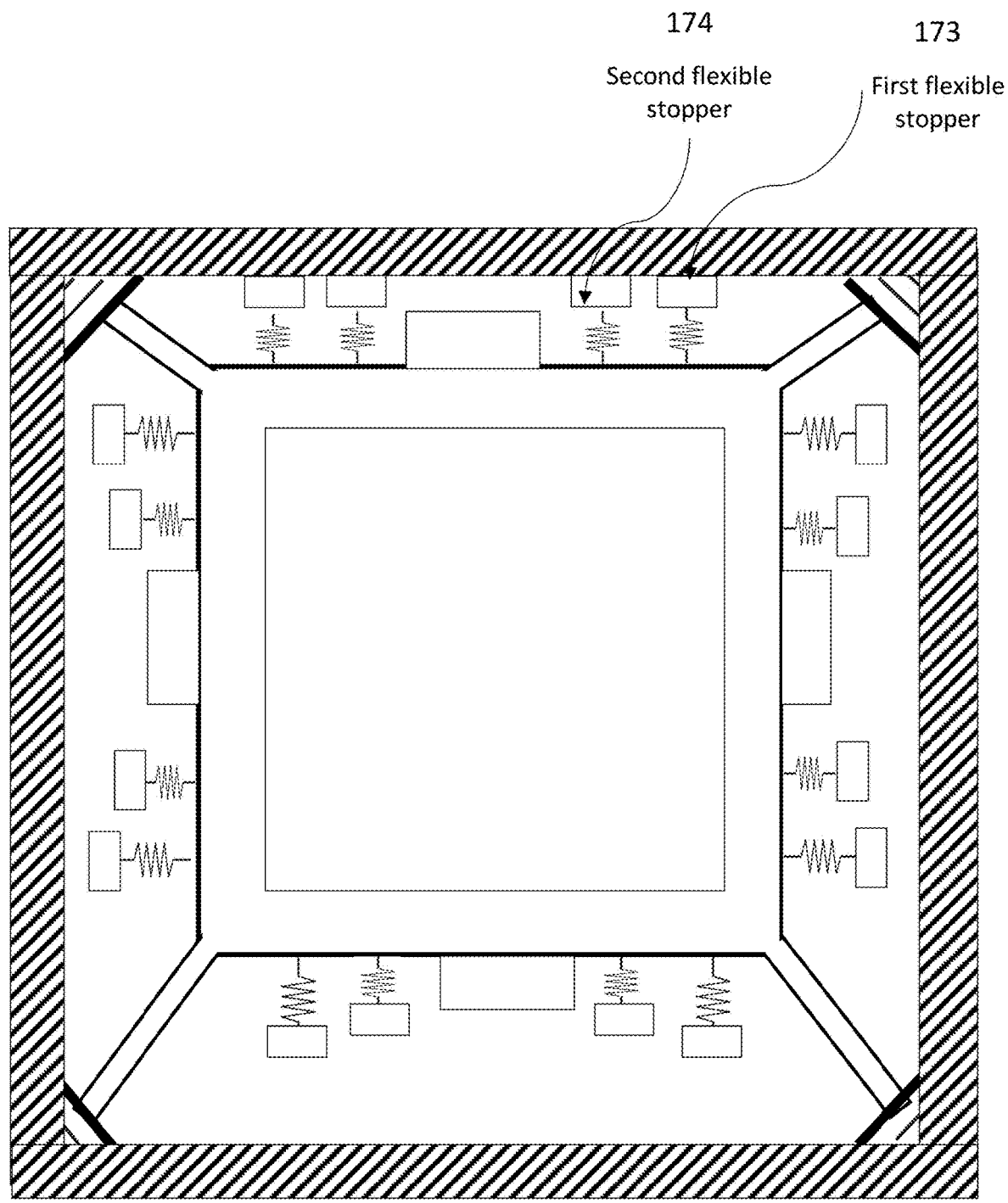
FIG. 1F illustrates further movement of the moving mass (rotor and image sensor) along the +y direction and the engagement of the second flexible stoppers with stationary outer periphery.
Figure 1G:
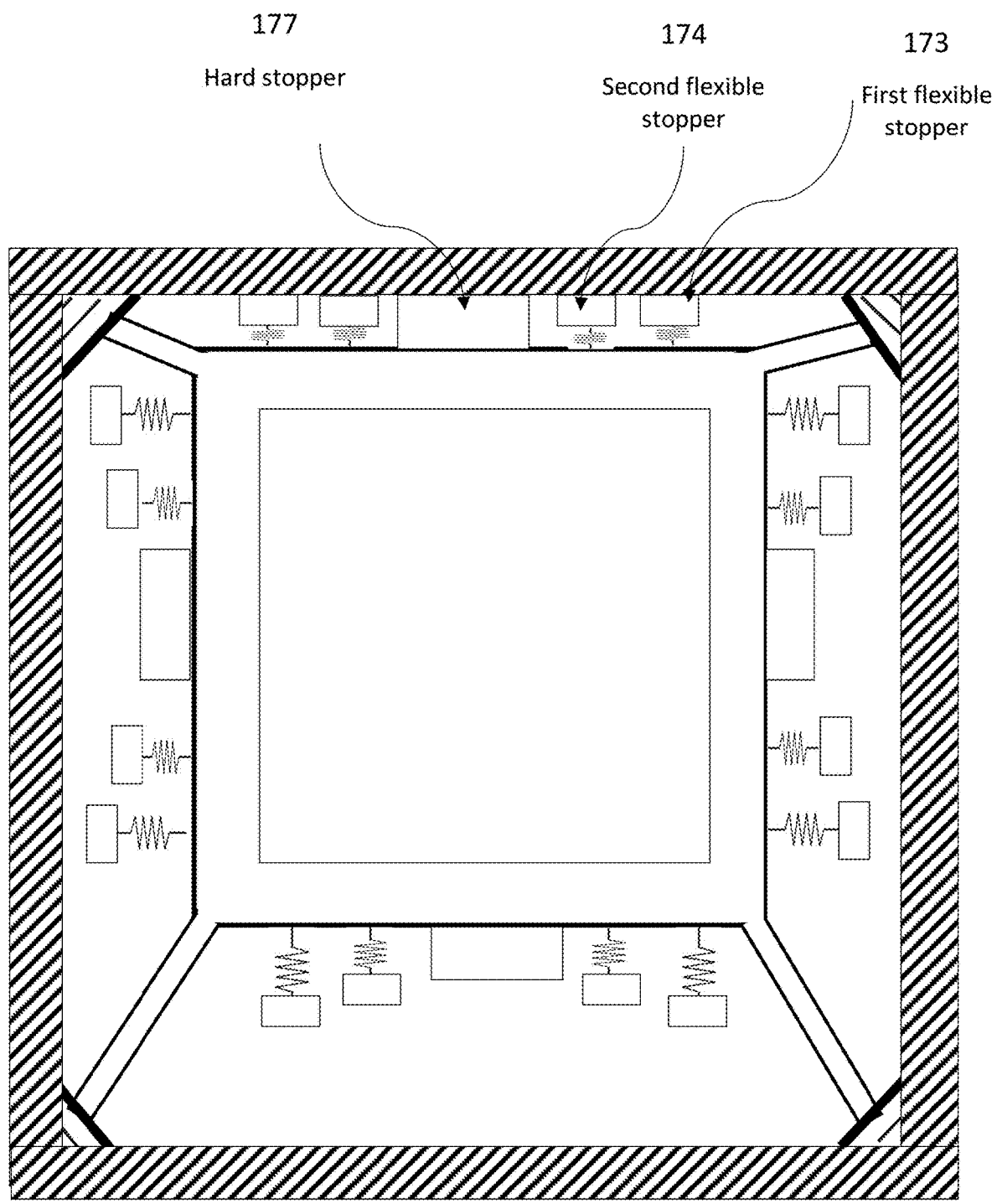
FIG. 1G illustrates a complete stop of the moving mass (rotor and image sensor) along the +y direction when the hard stopper engages with the stationary outer periphery.

FIG. 1E shows an example of deceleration of the moving mass when a shock is applied along the positive direction of the y-axis. The first flexible stoppers 173 engage first with the fixed outer periphery, then the second stoppers come into contact with the outer periphery to further decelerate the moving mass at higher rate, refer to FIG. 1F, and finally the hard stopper 177 engage to bring the moving mass to a complete stop, refer to FIG. 1G.

Figure 1H:
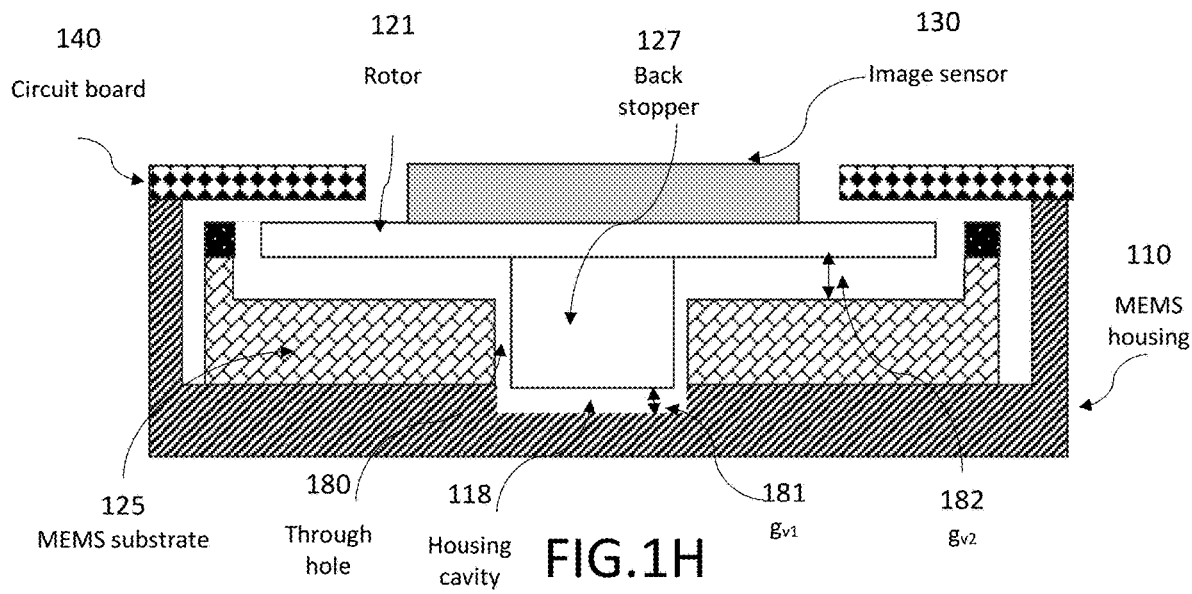
FIG. 1H illustrates a cross sectional view showing how the moving mass is stopped along the positive and negative directions of the z-axis using the structure of the package while the moving mass is in rest position.

FIG. 1H shows the deceleration mechanism along the positive and negative directions of the z-axis. The rotor has one or more protrusions (back stoppers 127) that extend vertically from the backside of the rotor and penetrate through the MEMS substrate 125 via through hole 180, refer to FIG. 1H. The MEMS housing 110 contains one or more cavities that are vertically aligned with the back stoppers 127 and have depth $g_v1$ 181 that is smaller than the gap $g_v2$ between the rotor and the substate.

Figure 1I:
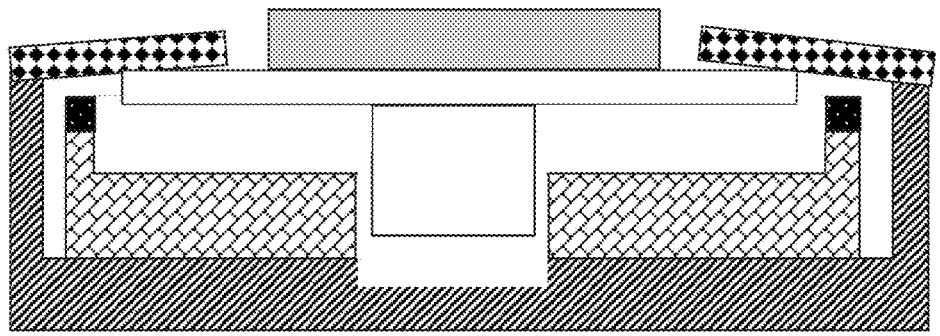
FIG. 1I illustrates a cross sectional view showing how the moving mass is stopped along the positive and negative directions of the z-axis using the structure of the package while the moving mass is stopped along the positive direction of the z-axis using the circuit board.
Figure 1J:
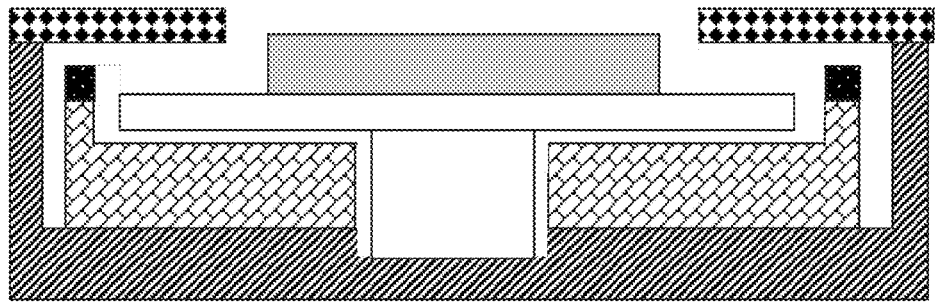
FIG. 1J illustrates a cross sectional view showing how the moving mass is stopped along the positive and negative directions of the z-axis using the structure of the package while the moving mass is stopped along the negative direction of the z-axis using the MEMS housing.

When a severe mechanical shock is applied along the negative direction of the z-axis, the back stopper stops the moving mass after moving a $g_v1$ distance preventing the collision between the MEMS rotor and substrate, refer to FIG. 1J. The MEMS housing may be coated with shock absorbent material such as Parylene or similar material to help reduce the impact. These stoppers may also be used as hard stoppers along the in-plane axes replacing hard stoppers 177 as they have large hit surface area since the thickness of the substrate is larger than that of the rotor.

Figure 1K:
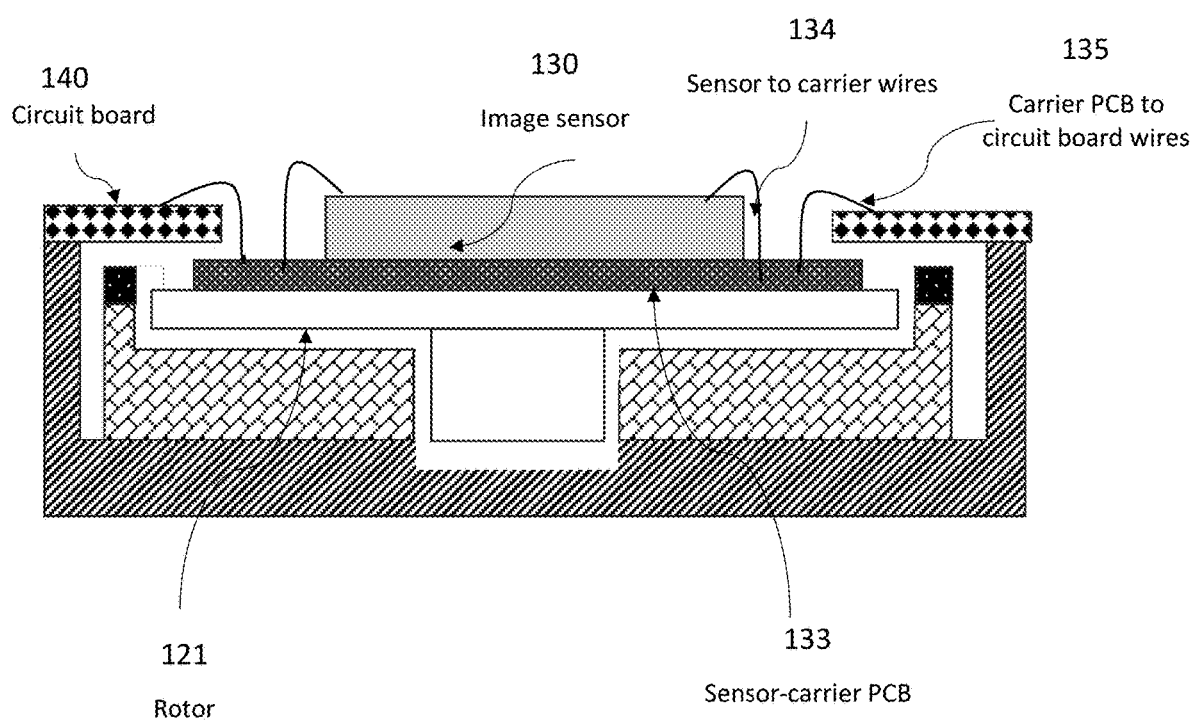
FIG. 1K illustrates a cross sectional view showing how the moving mass can be stopped along the positive of the z-axis using a carrier PCB that is sandwiched between the sensor and the actuators' rotor.

Another mechanism to stop the moving mass along the positive direction of the z-axis is by using another sensor-carrier PCB that is sandwiched between the sensor and rotor as shown in FIG. 1K. This sensor-carrier PCB 133 can be stopped by the circuit board 140 when the rotor moves up in response to mechanical shock. The sensor is wired first to the carrier PCB 133 (sensor to carrier wires 134) and the carrier PCB is wired to the circuit board 140 (Carrier PCB to circuit board wires 135). This mechanism reduces the shock that goes to the rotor (it made of brittle material—i.e. Silicon); instead, the hit becomes between two PCBs which are both made of ductile material (such as plastic, or one made of plastic and the other one made of metal). It also helps in reducing the number of the wires coming out of the sensor by making signal connections and routings within the carrier PCB so that the number of the wires coming out of the carrier PCBs—that are moving from one end and anchored to the fixed circuit board from the other end—are significantly reduced. The reduction in the number of moving wires results in decrease of their overall stiffness enabling the actuator to achieve high strokes at lower voltages.

In summary, the working principle of MEMS drop resistant mechanisms is as follows. The moving mass represents the rotor and the load (optical element) attached to it. When the MEMS actuator-sensor assembly package is exposed to a mechanical shock along the four directions of the in-plane axes (x and y), the first set of flexible stoppers 173 that are part of the moving rotor engage with the fixed outer periphery and decelerate the moving mass. The first set of flexible stoppers squeeze and store energy and then the second set of flexible stoppers 174 with higher stiffness $K_2$ engage and further decelerate the moving mass at higher rate. Finally, the hard stoppers 177 engage bringing the moving mass to a complete stop.

Figure 2:
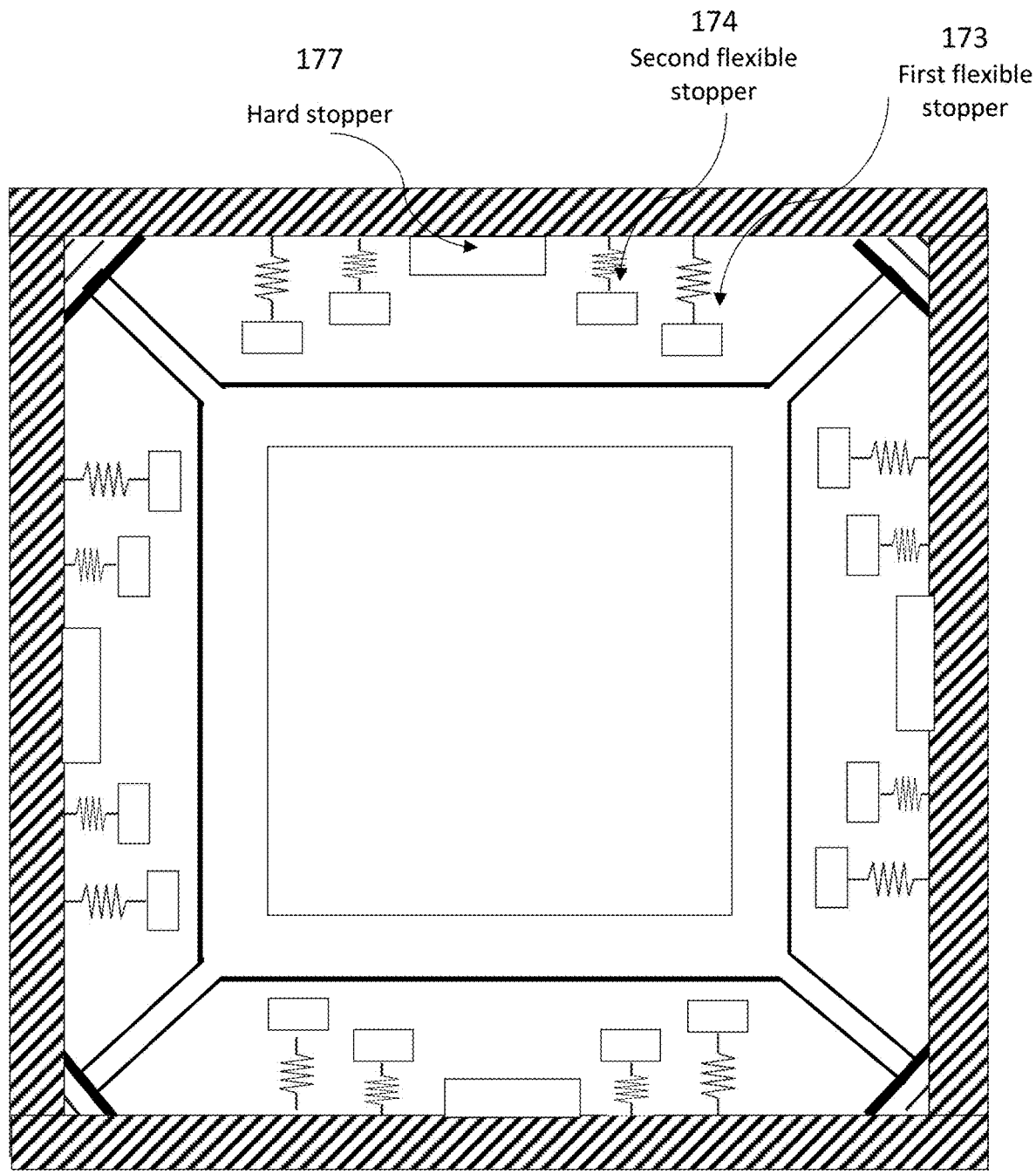
FIG. 2 illustrates the concept of the flexible and hard mechanical stoppers attached to the MEMS fixed outer periphery and used to decelerate and finally stop the MEMS moving mass along the in-plane axes (±x, ±y)

If the moving mass is larger, more than two sets of flexible stoppers could be used so that the moving mass is stopped by the hard stoppers without causing chipping or damage. In another example of the present invention, the flexible and hard stoppers may be attached to the outer fixed periphery while the sides of the moving mass are used to hit these flexible and hard stoppers, refer to FIG. 2.

When the MEMS actuator-sensor assembly package is exposed to a mechanical shock along the out of plane axis (−z), the back stoppers 127 are used to stop the moving mass after moving with a certain distance $g_v1$ that is larger than the required stroke of the actuator when it hits the bottom of the housing cavity. The ductile material of MEMS housing such as Aluminum helps to absorb the shock. A conformal elastic material could also be deposited on the housing to further help absorb the mechanical sock.

When the MEMS actuator-sensor assembly package is exposed to a mechanical shock along the out of plane axis (+z), the circuit board (part of the package) that sits on the topside of the MEMS actuator and surrounds the sensor from the four sides, works as a flexible stopper to the moving mass. It gets hit by the rotor and then bends to consume part of the energy leading to a deceleration of the moving mass along the +z axis, refer to FIG. 1I.

Figure 4:
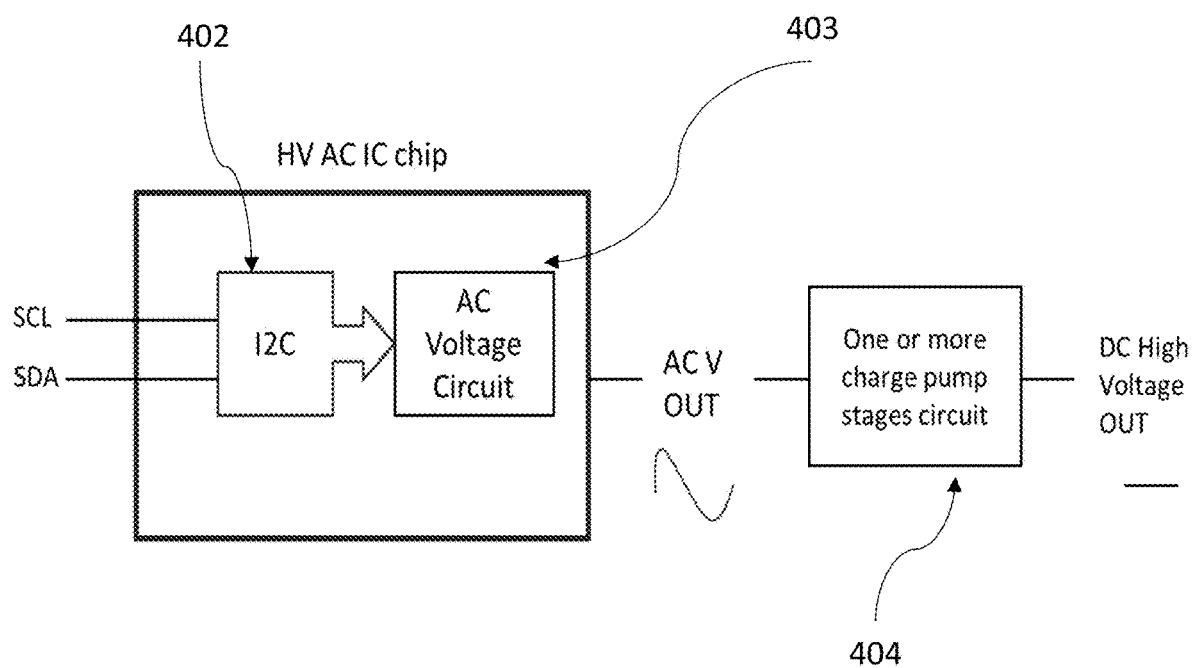

The integration of the MEMS driving circuit within the circuit board enables a smaller form factor solution. As the MEMS actuator requires a high level voltage for its operation, the MEMS driving circuit, refer to FIG. 4, may utilize off-the-shelf high voltage ICs 403 such as the MAX 14515 or similar to increase the voltage to higher levels by using a number of stages of a charge pump 404. The voltage output level of the circuit is controlled via I2C 402 to move the MEMS actuator moving element to different positions. A block diagram of such upgraded high voltage circuit is illustrated in FIG. 4.

Figure 3A:
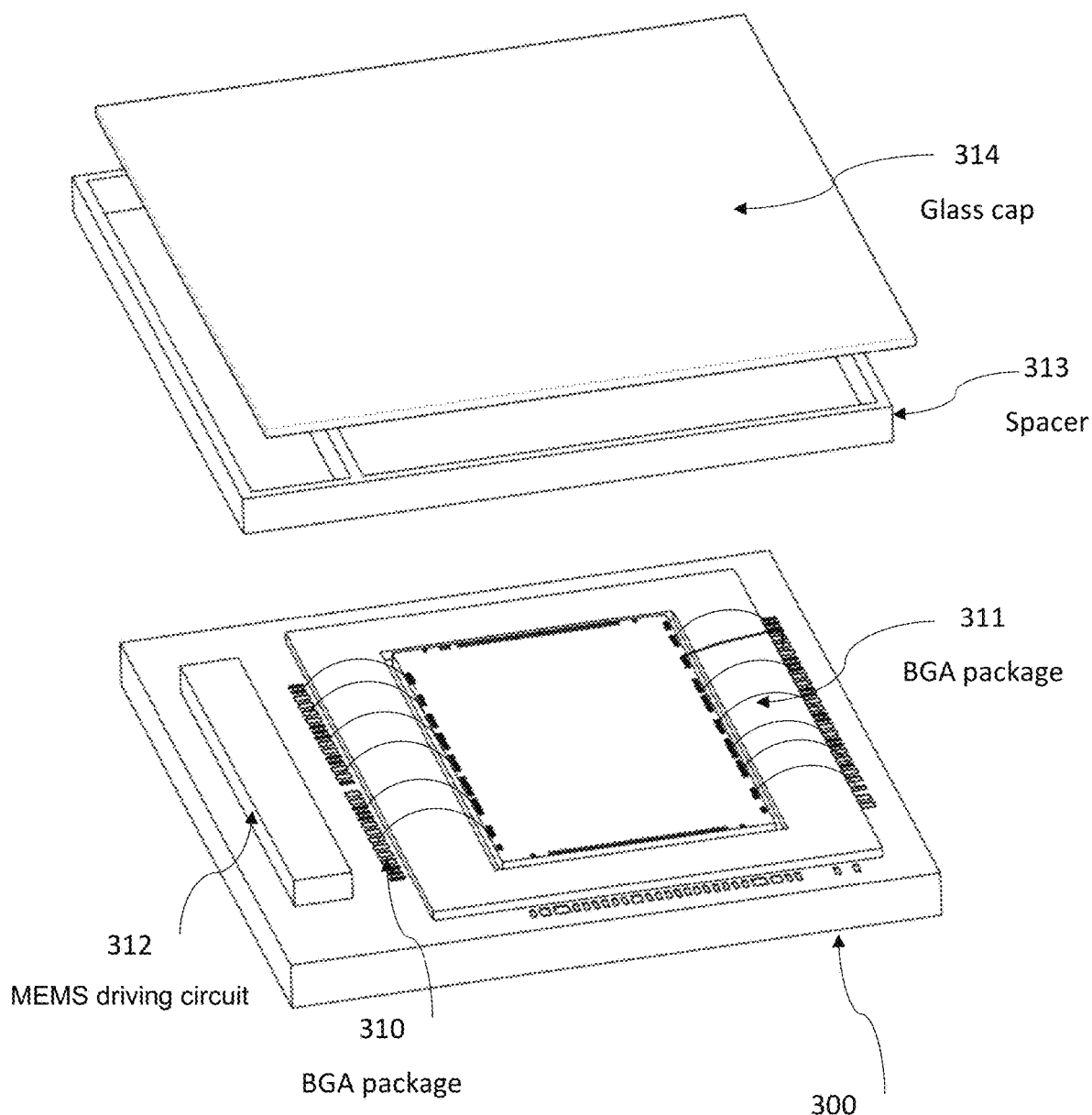
FIG. 3A illustrates an exploded view of another embodiment of the present invention of the drop resistant MEMS actuator-sensor assembly package employing ball grid array (BGA) substrate that is used to stop the MEMS actuator along the positive and negative directions of the z-axis
Figure 3B:
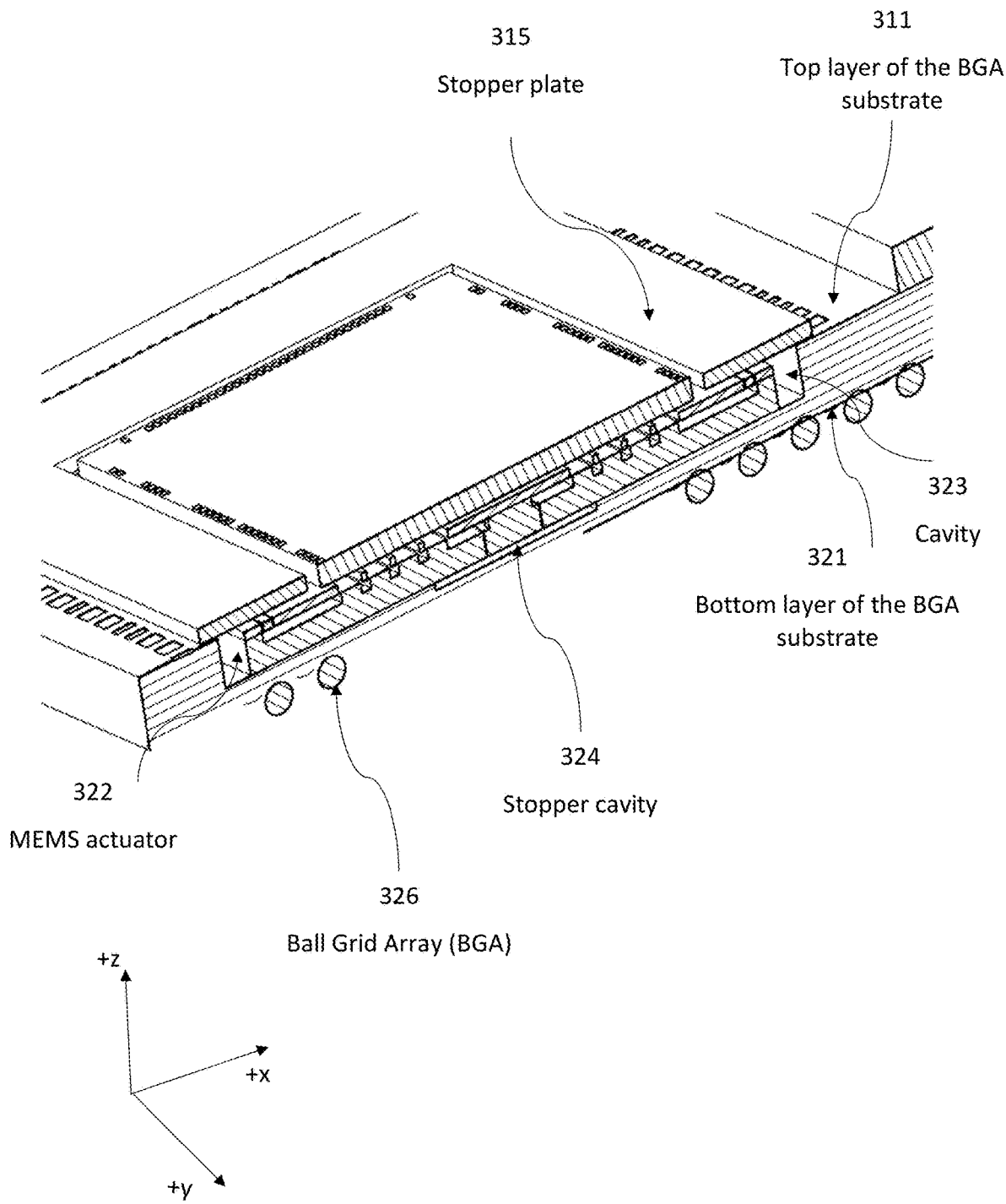
FIG. 3B illustrates a cross sectional view of the drop resistant MEMS actuator-sensor assembly package employing a ball grid array (BGA) substrate that is used to stop the MEMS along the positive and negative directions of the z-axis, and FIG. 4 illusrates a block diagram of an upgraded high voltage circuit in which the MEMS actuator requires a high level voltage for its operation.

Another embodiment of the present invention is illustrated in FIG. 3A-B. In this embodiment, the MEMS actuator is packaged within a BGA substrate 300 that consist of multilayers interconnected with vias. The signals of the image sensor are routed from the top layer 311 of the BGA substrate to the bottom layer 321 through vias/interconnects between these layers. The BGA substrate may be formed from a plastic (such Bismaleimide Triazine BT), ceramic or metal materials and could be formed from two or more layers. The BGA package has a cavity 323 sized to fit the MEMS actuator. The bottom face of the cavity contains a number of small size cavities 324 that are designed to fit the bottom stoppers of the MEMS actuator 322. The small cavities are designed with a certain depth larger that the required out-of-plane stroke of the actuator and are used to stop the MEMS moving rotor along the (−z) axis. An array of solder balls (BGA) 326 is attached to the bottom layer to enable soldering of the package to the camera main board. The package may have a through hole at the back of the actuator to enable stable wire-bonding.

A stopper plate 315, with a cut-out designed to fit the size of the image sensor while overlapping with the MEMS moving part, is attached to the edges of the substrate cavity 323. This stopper plate stops the MEMS actuator along the +Z-axis motion, and it bends when it gets hit by the MEMS moving part to absorb a portion of the shock. The wire-bonding from the image sensor to the BGA substrate is done after the attachment of this plate such that the moving wires are extended over the plate. The top layer of the BGA substrate may contain the MEMS driving circuit 312. A spacer 313 or a glass holder may be attached to the BGA substrate from the top side, which supports placement of a glass cap 314/or IR filter to provide protection for the MEMS actuator and image sensor.

The BGA substrate package offer a smaller footprint and is more mechanically reliable as it is attached to the main board using solder balls as opposed to adhesive bonding that might be affected due to hard environmental conditions.

The foregoing is considered as illustrative only of the principles of the invention. Further, since numerous modifications and changes will readily occur to those skilled in the art, it is not desired to limit the invention to the exact construction and operation shown and described, and accordingly, all suitable modifications and equivalents may be resorted to, falling within the scope of the invention.

With respect to the above description, it is to be realized that the optimum relationships for the parts of the invention in regard to size, shape, form, materials, function and manner of operation, assembly and use are deemed readily apparent and obvious to those skilled in the art, and all equivalent relationships to those illustrated in the drawings and described in the specification are intended to be encompassed by the present invention.

The invention claimed is:

1. A MEMS actuator-imager assembly package, comprising:
   a) an IR bracket or a glass holder;
   b) an IR filter or a glass cover attached to the IR filter or the glass holder;
   c) a MEMS actuator comprising a moving part, a fixed part and a plurality of mechanical springs; the moving part comprises of a rotor having a number of MEMS moving electrodes forming a first polarity of the MEMS actuator and attached to the fixed part via the plurality of mechanical springs; the fixed part of the MEMS actuator comprises of a substrate supporting a number of MEMS fixed electrodes forming a second polarity of the MEMS actuator;
   d) a first set of flexible stoppers attached to the rotor that are spaced apart from a fixed outer periphery with a certain gap $g_1$ and a stiffness K1;
   e) a second set of flexible stoppers attached to the rotor that are spaced apart from the fixed outer periphery with a certain gap $g_2$ that is larger than the $g_1$ gap and have a stiffness K2 that is larger than or equal to the K1 stiffness;
   f) a set of hard stoppers attached to the rotor and spaced with a gap $g_3$ that is larger than $g_1$ and $g_2$ gaps;
   g) a set of protrusions that extend vertically at a backside of the rotor and penetrate through the substrate via a through hole forming a negative z-axis mechanical stoppers;
   h) an image sensor attached to the rotor of the MEMS actuator;
   i) a MEMS housing with a cavity sized to fit and receive the MEMS actuator; the MEMS housing contains a number of cavities placed under the negative z-axis mechanical stoppers and have a depth larger than the vertical stroke of the actuator along the negative direction of the z-axis;
   j) a circuit board, with a cut-out sized to fit and receive the image sensor; wherein the MEMS housing is attached to the circuit board from the backside; the circuit board may contain a MEMS driving circuit that provides a voltage input to operate the MEMS actuator and overlaps with the moving rotor;
   whereby the first and second flexible stoppers along with the hard stoppers engage in a sequential manner with the moving mass in the presence of mechanical shocks along the four directions of the in-plane axes (x and y) bringing the moving mass to a complete stop; in the presence of mechanical shock along the positive and negative directions of the z-axis, the negative direction of the z-axis stoppers act to stop the moving mass along the negative z-axis direction by hitting the bottom surface of the MEMS housing cavities; the circuit board works as a flexible mechanical stopper for the moving mass along the positive direction of the z-axis.

2. The MEMS actuator-imager assembly package of claim 1, wherein the number of MEMS moving electrodes are through holes or tubes and the number of fixed MEMS electrodes form pistons protruding vertically and aligned with the through holes.

3. The MEMS actuator-imager assembly package of claim 1, wherein the first and second set of flexible stoppers and the set of hard stoppers are attached to the fixed outer periphery and a side of the moving rotor is used to engage with these stoppers.

4. The MEMS actuator-imager assembly package of claim 1, wherein the MEMS housing is coated with shock absorbent material such as Parylene or similar material.

5. The MEMS actuator-imager assembly package of claim 1, wherein the circuit board is coated with shock absorbent material such as Parylene or similar.

6. The MEMS actuator assembly package of claim 1, wherein the MEMS driving circuit utilizes a charge pump to extend the voltage level of another high voltage IC chip and supply MEMS actuator with varying voltage levels.

7. The MEMS actuator-imager assembly package of claim 1, wherein a sensor carrier PCB is sandwiched between said sensor and said rotor; said circuit board stops said carrier PCB when the MEMS actuator-imager assembly package is exposed to mechanical shock along the positive direction of the z-axis.

8. The MEMS actuator-imager assembly package of claim 7, wherein said sensor is first wired to said carrier PCB and said carrier PCB is wired to said circuit board with number of wires less or equal to the number of the wires of the image sensor.

9. A MEMS actuator assembly package, comprising:
   a) an IR bracket or a glass holder;
   b) an IR filter or a glass cover attached to the IR filter or the glass holder;
   c) a MEMS actuator comprises a moving part, a fixed part and a plurality of mechanical springs; said moving part comprises of a rotor having a number of moving electrodes forming a first polarity of the actuator and attached to the fixed part via the plurality of mechanical springs; the fixed part of the MEMS actuator consists of a substrate supporting a number of MEMS fixed electrodes forming a second polarity of the MEMS actuator;
   d) a first set of flexible stoppers attached to the rotor that are spaced apart from the fixed outer periphery with a certain gap $g_1$ and a stiffness K1;
   e) a second set of flexible stoppers attached to the rotor that are spaced apart from the fixed outer periphery with a certain gap $g_2$ that is larger than the $g_1$ gap and have a stiffness K2 that is larger than or equal to the K1 stiffness;

f) a set of hard stoppers attached to the rotor and spaced with gap $g_3$ that is larger than $g_1$ and $g_2$ gaps;

g) a set of protrusions that extend vertically at the backside of the moving rotor and penetrate through the substrate via a through hole forming negative z-axis mechanical stoppers;

h) an image sensor attached to the rotor of the MEMS actuator;

i) a ball-grid-array (BGA) substrate with a main cavity sized to fit and receive the MEMS actuator; the BGA substrate contains a number of stopper cavities placed under the negative z-axis mechanical stoppers and have depth larger than the vertical stroke of the actuator along the negative direction of the z-axis;

j) a stopper plate with a cut-out sized to fit and receive the image sensor; wherein the stopper plate is attached to the BGA substrate from the topside covering the main cavity and overlaps with the MEMS rotor; the BGA substrate may contain a MEMS driving circuit that provides voltage input to operate the MEMS actuator;

whereby the first and second flexible stoppers along with the hard stoppers engage in a sequential manner with the moving mass in the presence of mechanical shocks along the four directions of the in-plane axes (x and y) bringing the moving mass to a complete stop; in the presence of mechanical shock along the positive and negative directions of the z-axis, the negative direction of the z-axis stoppers act to stop the moving mass along the negative z-axis direction by hitting the bottom surface of the BGA substrate stopper cavities; the stopper plate works as a flexible mechanical stopper for the moving mass along the positive direction of the z-axis.

10. The MEMS actuator assembly package of claim 9, wherein the stopper plate is coated with shock absorbent material such as Parylene or similar material.

11. The MEMS actuator assembly package of claim 9, wherein the BGA substrate is made of ceramic, metal, or plastic (such as Bismaleimide Triazine BT or similar material).

12. The MEMS actuator assembly package of claim 9, wherein the MEMS driving circuit utilizes a charge pump to extend the voltage level of another high voltage IC chip and supply MEMS actuator with varying voltage levels.

13. The MEMS actuator assembly package of claim 9, wherein said sensor is directly wire-bonded to said BGA substrate; said BGA substrate to provide signal routing and connection path from the sensor to the outside circuitry.

14. The MEMS actuator assembly package of claim 9, wherein a sensor carrier PCB is sandwiched between said sensor and said rotor; said stopper plate stops said carrier PCB when the MEMS actuator-imager assembly package is exposed to mechanical shock along the positive direction of the z-axis.

15. The MEMS actuator assembly package of claim 14, wherein said sensor is first wired to said carrier PCB and said carrier PCB is wired to said BGA substrate with number of wires less or equal to the number of the wires of the image sensor.

\* \* \* \* \*